(12) United States Patent
Ting et al.

(10) Patent No.: US 8,953,370 B2
(45) Date of Patent: Feb. 10, 2015

(54) MEMORY CELL WITH DECOUPLED READ/WRITE PATH

(71) Applicant: Taiwan Semiconductor Manufacturing Company, Ltd., Hsin-Chu (TW)

(72) Inventors: Yu-Wei Ting, Taipei (TW); Kuo-Ching Huang, Hsinchu (TW); Chun-Yang Tsai, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 72 days.

(21) Appl. No.: 13/773,366

(22) Filed: Feb. 21, 2013

(65) Prior Publication Data

US 2014/0233294 A1 Aug. 21, 2014

(51) Int. Cl.
*G11C 11/36* (2006.01)
*G11C 7/02* (2006.01)
*G11C 5/06* (2006.01)
*G11C 5/08* (2006.01)
*G11C 11/16* (2006.01)
*G11C 13/00* (2006.01)

(52) U.S. Cl.
CPC .. *G11C 7/02* (2013.01); *G11C 5/06* (2013.01); *G11C 5/08* (2013.01); *G11C 11/1673* (2013.01); *G11C 13/0002* (2013.01); *G11C 11/1675* (2013.01)
USPC ....... 365/175; 365/243; 365/148; 365/189.16

(58) Field of Classification Search
CPC .... B82Y 10/00; G11C 11/36; G11C 2213/72; G11C 13/0004; H01L 27/1021
USPC .............................. 365/175, 243, 148, 189.16
See application file for complete search history.

(56) References Cited

U.S. PATENT DOCUMENTS

2009/0052235 A1* 2/2009 Horii et al. .................... 365/163

* cited by examiner

*Primary Examiner* — Jason Lappas
(74) *Attorney, Agent, or Firm* — Haynes and Boone, LLP

(57) ABSTRACT

A memory cell with a decoupled read/write path includes a switch comprising a first terminal connected to a first line and a second terminal connected to a second line, a resistive switching device connected between a gate of the switch and a third line, and a conductive path between the gate of the switch and the second line.

20 Claims, 8 Drawing Sheets

MEMORY CELL WITH DECOUPLED READ/WRITE PATH

BACKGROUND

There is a frequent demand for smaller devices with more memory. Some efforts have been initiated in resistive memory as a mechanism for creating more memory in less space. Resistive memory systems use a resistive element that can change and maintain the value of its resistivity based on applied conditions. For example, a high resistive state may be used to represent a logical '1' while a low resistive state may be used to represent a logical '0'.

Such resistive memory cells are often constructed as an array of memory cells, with each cell being placed on intersecting conductive lines. To set or read the state of a particular memory cell within the array, the conductive lines connecting to that memory cell are selected. The selected lines can have various electrical conditions applied in order to set or read the resistive state of the targeted memory cell.

For example, a voltage may be applied to the appropriate conductive lines to read the state of a target memory cell. This voltage causes an electric current to flow through the target memory cell. Based on the value of this electric current, the resistive state of the memory cell can be determined. Electric current, however, will also flow through the conductive lines to unselected memory cells and may adversely affect the sensing operation that measures the value of the electric current flowing through the target memory cell. This current is often referred to as a sneak current. It is desirable to design a memory cell and array architecture that avoids the sneak current issue.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
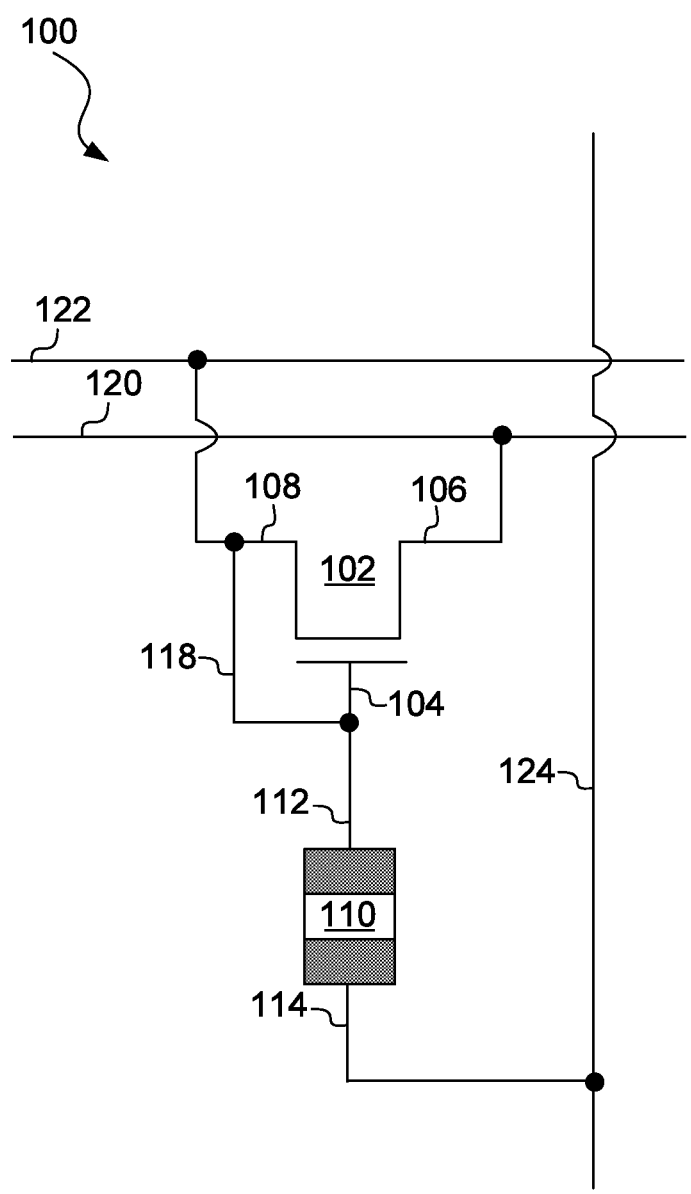
FIG. 1 is a diagram showing an illustrative memory cell with a decoupled read/write path, according to one example of principles described herein.

FIG. 1 is a diagram showing an illustrative memory cell with a decoupled read/write path. According to the present example, the memory cell 100 includes a switch 102 and a resistive switching device 110. The switch 102 may be a transistor such as a Metal Oxide Semiconductor Field Effect Transistor (MOSFET). The resistive switching device 110 may be a metal-insulator-metal resistive device or a Magnetoresistive Tunnel Junction (MTJ) device.

The memory cell 100 is placed at an intersection between a word line 122 and a bit line 124. A source line 120 also runs parallel to the word line 122. Memory cells are often organized into arrays, arranged in rows and columns. A word line driver will selectively assert a word line, which is connected to a row of memory cells each storing a bit of information. When a word line is asserted, each of the connected memory cells provides its stored bit of information on one or more bit lines. The bit lines are provided to sense amplifiers, which are used to select one or more columns of the array and amplify the stored bit(s) of information accordingly. The configuration of bit lines and word lines described herein are merely one embodiment of a memory array.

According to the present example, the first terminal 106 of the switch 102 is connected to the source line 120. Additionally, the second terminal 108 of the switch 102 is connected to the word line 122. The gate 104 of the switch 102 is connected to the first terminal 112 of the resistive switching device. Moreover, a conductive path 118 runs between the second terminal 108 and the gate 104. The conductive path 118 is a separate path from the switch that allows an electric current to flow through the memory cell without flowing between the terminals 106, 108 of the switch 102.

In the present example, the switch 102 is an NMOS device. Such a device is in an ON state when a high voltage is applied to the gate 104. While in the ON state, electric current is allowed to pass between the two terminals 106, 108 which are often referred to as source and drain terminals. When a relatively low voltage signal is applied to the gate 104, then the NMOS switch 102 is in an OFF state. In such a state, electric current is prohibited from flowing between the two terminals 106, 108.

The resistive switching device 110 is placed between the switch 102 and the bit line 124. Specifically, the first terminal 112 of the resistive switching device 110 is connected to the gate 104 of the switch 102. The second terminal 114 of the resistive switching device 110 is connected to the bit line 124.

In some examples, the resistive switching device 110 is a metal-insulator-metal resistive switching device. Such a device exhibits a resistive state that is based on both present and past electrical conditions. For example, a particular voltage applied may set the resistive switching device 110 into a high resistive state. Additionally, a sufficient voltage of opposite polarity may set the resistive switching device into a relatively low resistive state.

The metal-insulator-metal resistive switching device may include a dielectric layer between a top electrode and a bottom electrode. The electrodes may be made of a variety of conductive materials such as metals or metal nitrides. The dielectric layer may be made of a one of several metal oxides such as titanium dioxide ($TiO_2$).

In some examples, the resistive switching device 110 is an MTJ device that changes its resistive state based on the state of magnetic materials within the device. An MTJ device includes a thin resistive layer between two ferromagnetic layers. One magnetic layer may be referred to as the reference layer. The other magnetic layer may be referred to as the free layer. The magnetic moment of the reference later generally maintains the same direction. Conversely, through application of a voltage across the junction, the direction of the magnetic moment of the free layer can be reversed. When the direction of the magnetic moment of both the free layer and the reference layer are the same, electrons can more easily tunnel through the thin resistive layer. In this state, the junction has a relatively low resistivity. Through application of a voltage with the opposite polarity, the magnetic moment of the free layer can be switched to oppose the direction of the magnetic moment of the reference layer. In this state, it is more difficult for electrons to tunnel through the resistive layer, causing the junction to have a relatively high resistivity. The different resistive states can be used to store logical values.

Figure 2:
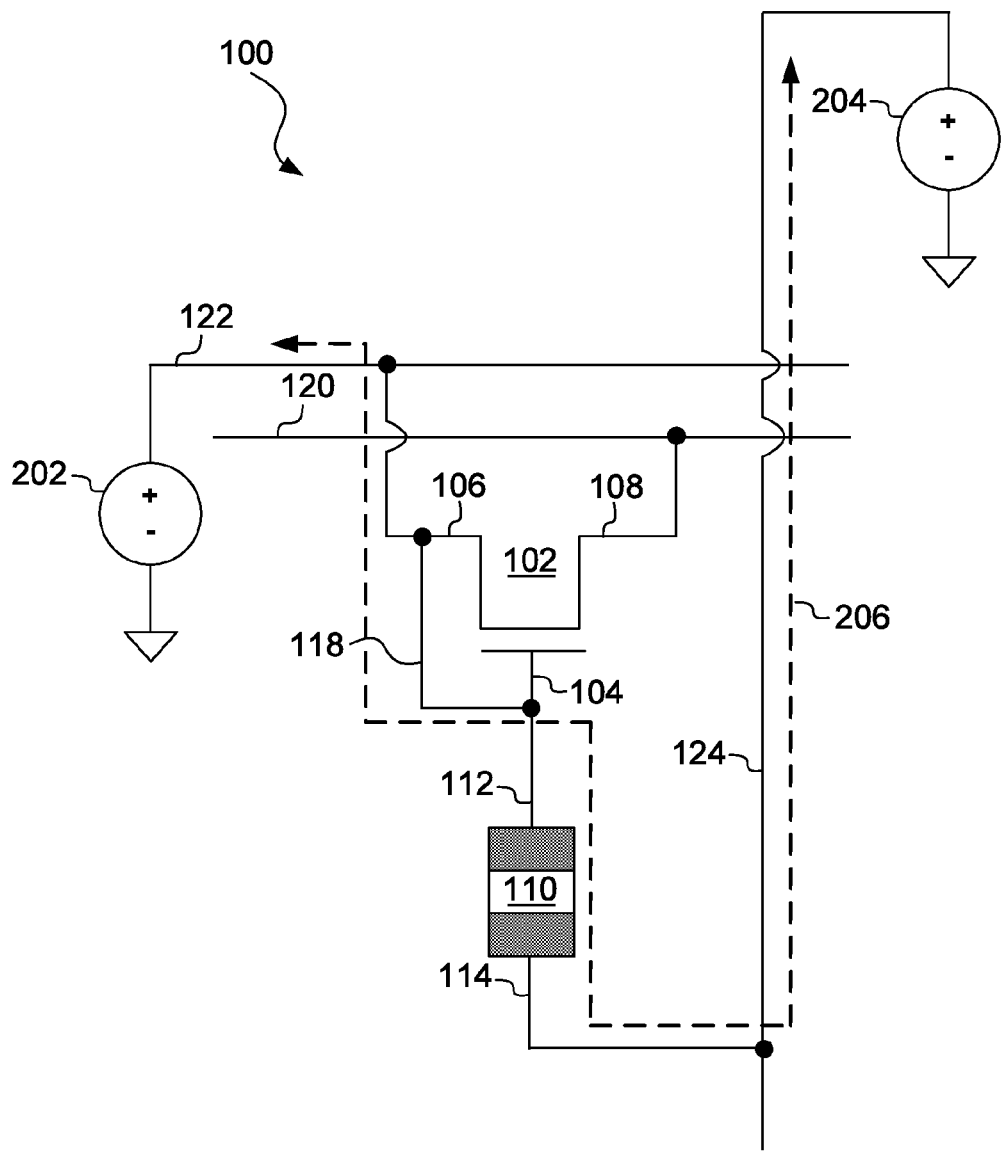
FIG. 2 is a diagram showing an illustrative write process for a memory cell with a decoupled read/write path, according to one example of principles described herein.

FIG. 2 is a diagram showing an illustrative write process for a memory cell with a decoupled read/write path. In one example, the state of the resistive switching device 110 can be set to a logical '0' by applying a write voltage 202 to the word line 122 while grounding the bit line 124. Doing so will cause an electric current 206 to flow through the conductive path 118 and through the resistive switching device 110. Because application of the write voltage 202 sets the switch 102 to an ON state, the source line 120 is set to float. This ensures that the electric current 206 will not flow through the switch 102 and will instead flow through the resistive switching device 110. Because the electric current 206 does not go through the transistor, there is less resistance in the write path and thus a higher write current is achieved.

To set the state of the resistive switching device 110 to represent a logical '1', a write voltage 204 is applied to the bit line 124 while the word line 122 becomes grounded. The source line 120 remains floating. In this case, the electric current 206 will flow from the bit line 124, through the resistive switching device 110, through the conductive path 118, and to the word line 122. Because the electric current 206 flows in the opposite direction, it will set the resistive switching device to a different state, either a high resistive state or a low resistive state, depending on the design of the memory cell 100.

Figure 3:
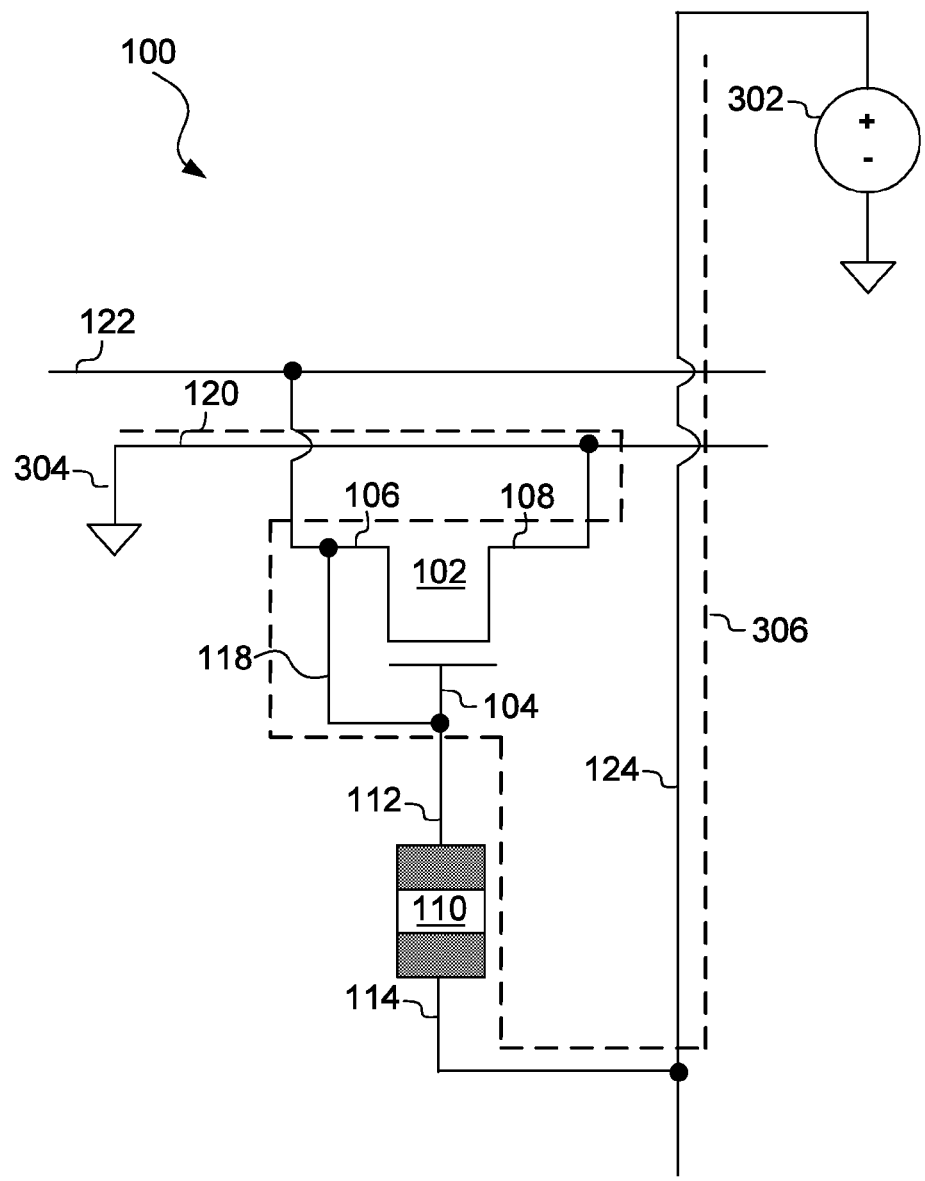
FIG. 3 is a diagram showing an illustrative read process for a memory cell with a decoupled read/write path, according to one example of principles described herein.

FIG. 3 is a diagram showing an illustrative read process for a memory cell with a decoupled read/write path. According to the present example, the state of the resistive switching device 110 can be determined by applying a read voltage 302 to the bit line and grounding the source line 120. The word line 122 is left floating. The value of the read voltage 302 may be substantially less than the value of the write voltage.

With the application of the read voltage 302, an electric current 306 flows through the bit line 124 and through the resistive switching device 110. This current 306 will also set the switch 102 to an ON state. Because the word line 122 is floating and the source line 120 is grounded, the electric current 306 flows through the conductive path 118 and then through the terminals 106, 108 of the switch 102 to the source line 120. As such, the electric current 306 takes a different path during the read operation than it does the write operation. Thus, the read path is decoupled from the write path.

The value of the electric current depends on the resistive state of the resistive switching device. Specifically, if the resistive switching device 110 is in a low resistive state, then the read current 306 will be relatively high. Conversely, if the resistive switching device 110 is in a high resistive state, then the read current 306 will be relatively low. A sense amplifier can be used to measure the read current 306 and determine the state of the resistive switching device 110 and thus the logical value stored in the memory cell 100.

Figure 4:
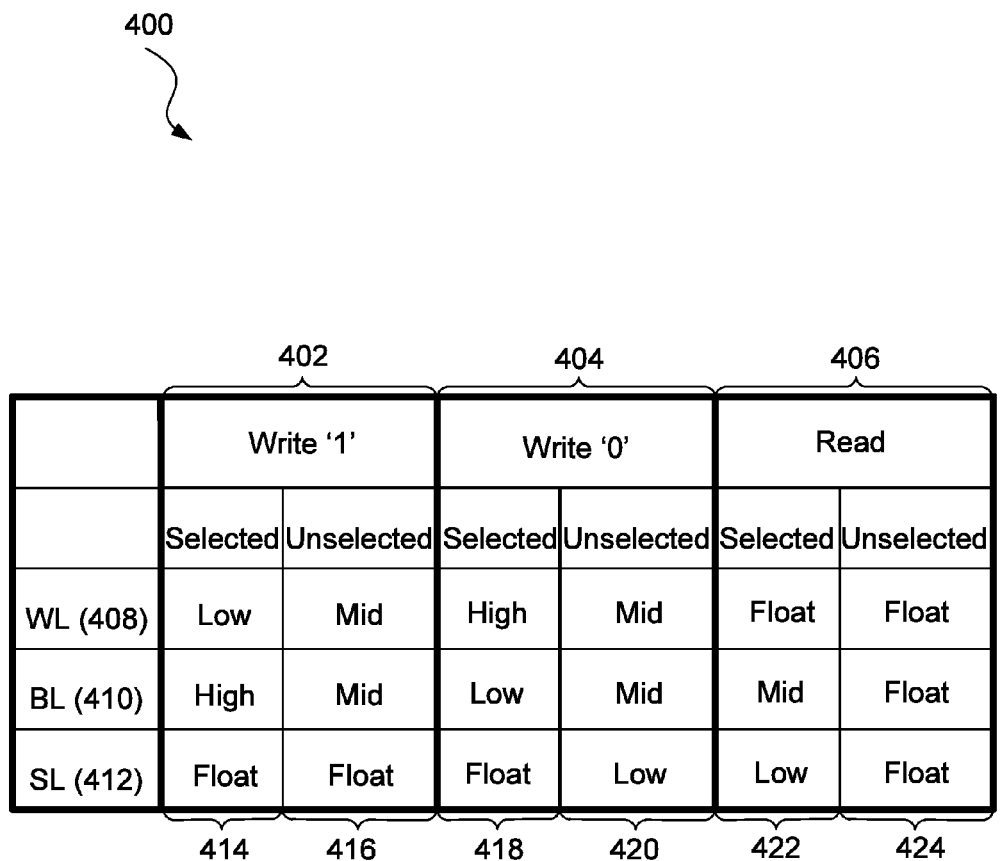
FIG. 4 is a chart showing illustrative operations for a memory cell with a decoupled read/write path, according to one example of principles described herein.

FIG. 4 is a chart 400 showing illustrative operations for a memory cell with a decoupled read/write path. The chart illustrates how the selected and unselected lines are connected to perform various operations with a memory array having memory cells as described herein. The chart 400 includes a write '1' column 402, a write '0' column 404, and a read column 406. Each column is divided into a selected column and an unselected column. Specifically, the write '1' column 402 includes a selected column 414 and an unselected column 416. Likewise, the write '0' column 404 includes a selected column 418 and an unselected column 420. The read column 406 also includes a selected column 422 and an unselected column 424.

The write '1' operation, for example, may put the resistive switching device into a high resistive state. As mentioned above, this is done by applying a low voltage to the word line connected to the target memory cell and a high voltage to the bit line connected to the target memory cell. Additionally, the source line is set to float. The unselected lines, which are the lines connected to memory cells other than the target cell, are also set as defined in the chart 400. Specifically, the word lines and the bit lines of the non-target memory cells are connected to a mid voltage level. This reduces the voltage differential between the selected lines and the unselected lines and thus reduces the sneak currents that may adversely affect the resistive state of unselected memory cells.

In one example, a high voltage may be the $V_{DD}$, or operating voltage, of the integrated circuit of which the memory array is part. Additionally, the low voltage may be ground. The mid level voltage may be about half of the high voltage level, or $V_{DD}$.

The write '0' operation is similar to the write '1' operation. The difference is that the word line connected to the target memory cell has a high voltage connected while the bit line connected to the target memory cell has a low voltage connected. This produces an electric current through the resistive switching device that is in the opposite direction as the electric through the resistive switching device during the write '1' operation.

For the read operation, the word line connected to the selected memory cell is now set to float. The bit line is connected to a mid voltage while the source line is connected to a low voltage level. As mentioned above, this causes an electric current to flow through the resistive switching device, through the conductive path, and through the switch terminals. The unselected lines are all set to float.

Figure 5:
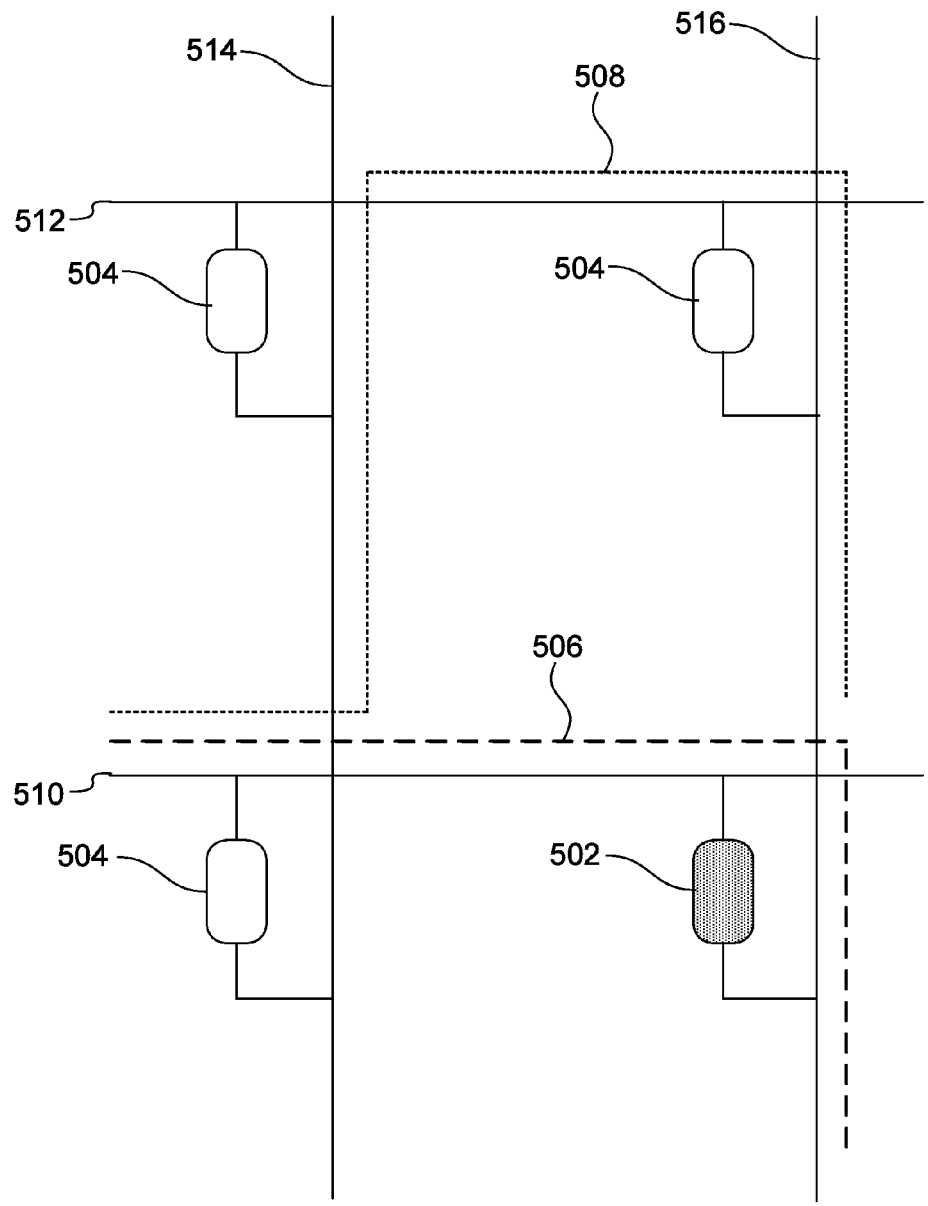
FIG. 5 is a diagram showing an illustrative sneak current through an array of memory cells, according to one example of principles described herein.

FIG. 5 is a diagram showing an illustrative sneak current through an array of memory cells. As mentioned above, the sneak currents can cause issues during the read process. FIG. 5 illustrates a simplified array for the purpose of illustrating the sneak path. According to the present example, a read voltage is applied to the bit line 516 of the selected memory cell 502. This causes a desired electric current 506 to flow through the selected memory cell 502 and along the select line 510 of the selected memory cell 502.

As an unintended consequence, the application of the read voltage also causes a sneak current 508 to flow through the unselected memory cells 504 and unselected lines 512, 514. If the sneak current is not accounted for, it can adversely affect the measurement of the read current 506 and this can make it difficult to determine the resistive state of the selected memory cell 502.

The memory cell embodying principles described herein has a higher is less affected by the sneak currents. Specifically, because the read path goes through the switch terminals, there is a higher RC time constant for the path. That is, it takes longer for the sneak current 508 to charge the gate of the switch of the selected memory cell 502 than does the read current 506. Thus, if the read operation is timed appropriately, the sneak current does not become a significant issue.

Figure 6:
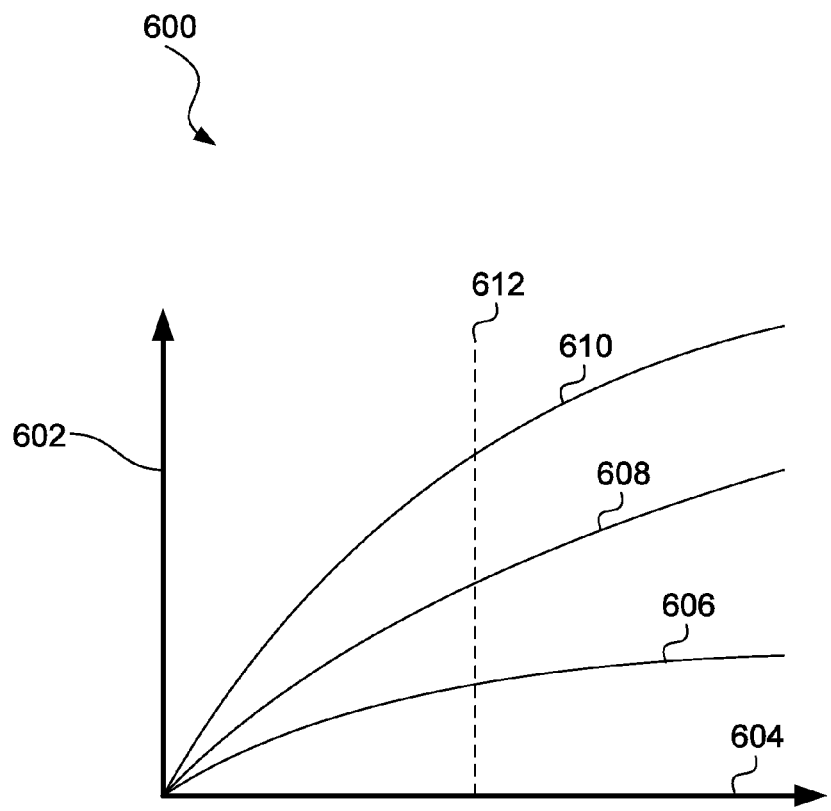
FIG. 6 is a graph showing illustrative timing of a read operation for a memory cell with a decoupled read/write path, according to one example of principles described herein.

FIG. 6 is a graph 600 showing illustrative timing of a read operation for a memory cell with a decoupled read/write path. The vertical axis 602 of the graph 600 represents the voltage level at the switch gate of a selected memory cell. The horizontal axis 604 represents time. The first line 606 represents the voltage at the gate resulting from the sneak currents. The second line 608 represents the voltage at the gate resulting from the read current flowing through a selected memory cell in a high resistive state. The third line 610 represents the voltage at the gate resulting from a read current flowing through a selected memory cell in a low resistive state. The dotted line 612 represents the timing of when the value of the read current is measured by the sense amplifier. This is done long enough after application of the read voltage but before the sneak current has enough time to charge up the gate too much and adversely affect the measurement.

Figure 7:
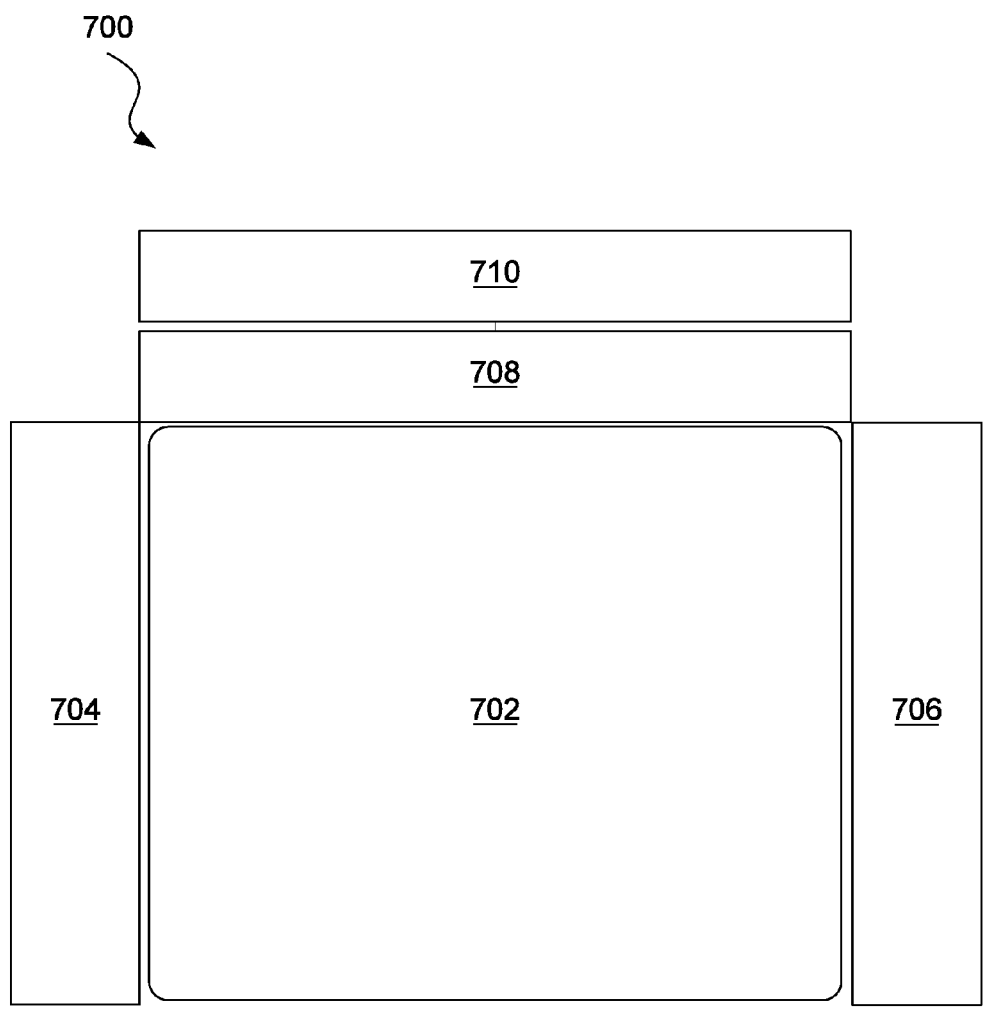
FIG. 7 is a diagram showing an illustrative memory array of memory cells with decoupled read/write paths, according to one example of principles described herein.

FIG. 7 is a diagram showing an illustrative memory array 700 of memory cells with decoupled read/write paths. According to certain illustrative examples, the memory array 700 may include a set 702 of memory cells surrounded by control circuitry. The control circuitry 704 for the word lines may be placed on one side of the array 700. This circuitry 704 includes the various components that select and apply signals to specific word lines within the array 700.

According to the present example, control circuitry 706 for the source lines may be placed on the opposite side of the array from the word line control circuitry 704. The source line circuitry 706 includes the various components that select and apply certain signals to specific source lines within the array.

According to the present example, the control circuitry 710 for the bit lines may be placed on a different side of the array than the word line control circuitry 704 and the source line control circuitry 706. The bit line control circuitry 306 includes the various components that select and apply signals to various bit lines. Additionally, the sense amplifiers 708 and the accompanying control circuitry may be placed on the same side of the array as the bit line control circuitry 710.

Figure 8:
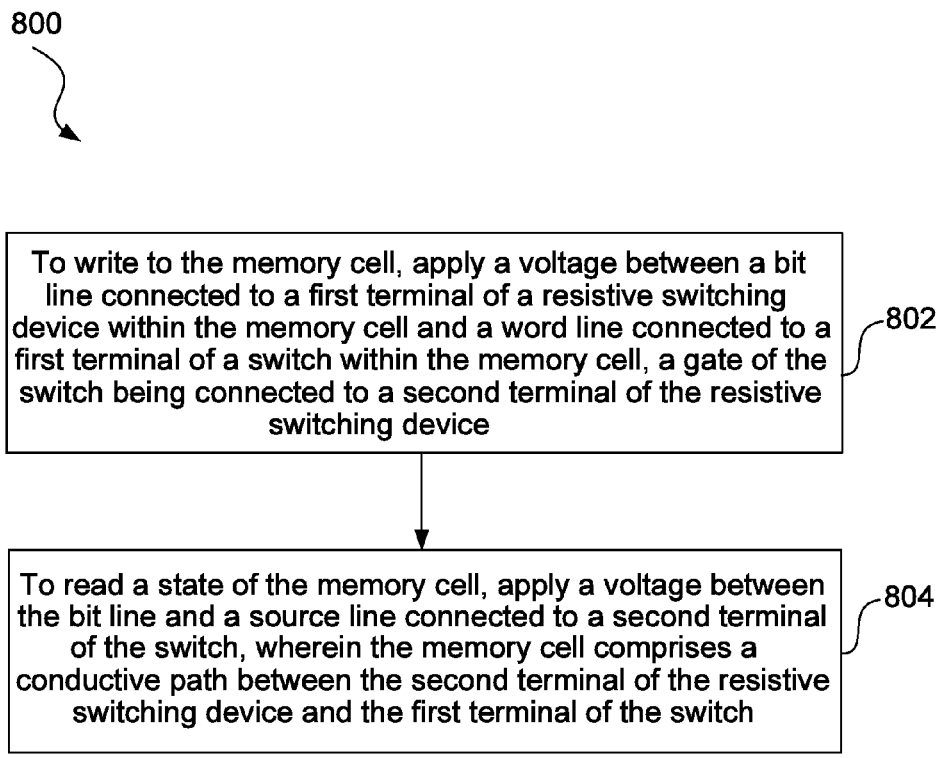
FIG. 8 is a flowchart showing an illustrative method for operating a memory cell with a decoupled read/write path, according to one example of principles described herein.

FIG. 8 is a flowchart showing an illustrative method for operating a memory cell with a decoupled read/write path. According to certain illustrative examples, the method includes a step of, to write to the memory cell, applying 802 a voltage between a bit line connected to a first terminal of a resistive switching device within the memory cell and a word line connected to a first terminal of a switch within the memory cell, a gate of the switch being connected to a second terminal of the resistive switching device. The method further includes a step of, to read a state of the memory cell, applying 804 a voltage between the bit line and a source line connected to a second terminal of the switch. The memory cell includes a conductive path between the second terminal of the resistive switching device and the first terminal of the switch.

A memory array includes a number of bit lines, a number of word lines, a number of source lines, and a number of memory cells. Each memory cell includes a switch having a first terminal connected to a source line and a second terminal connected to a word line. Each memory cell also includes a resistive switching device connected between a gate of the switch and a bit line. Each memory cell also includes a conductive path between the gate of the switch and the word line.

According to certain illustrative examples, a memory cell with a decoupled read/write path includes a switch comprising a first terminal connected to a first line and a second terminal connected to a second line, a resistive switching device connected between a gate of the switch and a third line, and a conductive path between the gate of the switch and the second line.

According to certain illustrative examples, a method for operating a memory cell with a decoupled read/write path, the method includes, to write to the memory cell, applying a voltage between a bit line connected to a first terminal of a resistive switching device within the memory cell and a word line connected to a first terminal of a switch within the memory cell, a gate of the switch being connected to a second terminal of the resistive switching device. The method further includes, to read a state of the memory cell, applying a voltage between the bit line and a source line connected to a second terminal of the switch. The memory cell includes a conductive path between the second terminal of the resistive switching device and the first terminal of the switch.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A memory array comprising:
 a number of bit lines;
 a number of word lines;
 a number of source lines; and
 a number of memory cells, each memory cell comprising:
  a switch comprising:
   a gate;
   a first terminal connected to a source line; and
   a second terminal connected to a word line;
  a resistive switching device connected between the gate of the switch and a bit line; and
  a conductive path between the gate of the switch and the word line.

2. The memory array of claim 1, wherein the resistive switching device comprises a metal-insulator-metal switching device.

3. The memory array of claim 1, wherein the resistive switching device comprises a Magnetoresistive Tunnel Junction (MTJ) device.

4. The memory array of claim 1, wherein a read path of the memory cell takes a different path through the memory cell than does a write path of the memory cell.

5. The memory array of claim 1, further comprising a voltage source to be selectively applied between a bit line and a word line, causing a current to flow through the conductive path and not the switch of a memory cell at an intersection of the bit line and the word line.

6. The memory array of claim 1, further comprising a voltage source to be selectively applied between a source line and a bit line, causing a current to flow through both the conductive path and the switch of a memory cell at an intersection of the bit line and the source line.

7. The memory array of claim 6, wherein a value of the voltage applied between the source line and the bit line is such that a state of the resistive switching device can be read by a sense amplifier.

8. The memory array of claim 6, wherein a structure of the memory array is such that an electric current resulting from sneak currents as sensed by a sense amplifier is nominal in comparison to an electric current flowing through the resistive switching device of a selected memory cell.

9. A memory array comprising:
 a plurality of first lines, second (source) lines, and third lines; and
 an array of memory cells, wherein each cell comprises:
  a switch comprising a gate, a first terminal connected to one of the first lines and a second terminal connected to one of the second lines;
  a resistive switching device connected between the gate of the switch and one of the third lines; and
  a conductive path between the gate of the switch and the second line.

10. The memory array of claim 9, wherein the resistive switching device comprises a metal-insulator-metal switching device.

11. The memory array of claim 9, wherein the resistive switching device comprises a Magnetoresistive Tunnel Junction (MTJ) device.

12. The memory array of claim 9, wherein a read path of the memory cell takes a different path through the memory cell than does a write path of the memory cell.

13. The memory array of claim 9, further comprising a voltage source to be selectively applied between the second line and the third line of a memory cell, causing a current to flow through the conductive path and not the switch.

14. The memory array of claim 9, further comprising a voltage source to be selectively applied between the first line and the third line of a memory cell, causing a current to flow through both the conductive path and the switch.

15. The memory array of claim 14, wherein a value of the voltage applied between the first line and the third line is such that a state of the resistive switching device can be read by a sense amplifier.

16. A method for operating a memory cell in a memory cell array, the method comprising:
 to write to the memory cell, applying a voltage between a bit line connected to a first terminal of a resistive switching device within the memory cell and a word line connected to a first terminal of a switch within the memory cell, a gate of the switch being connected to a second terminal of the resistive switching device; and
 to read a state of the memory cell, applying a voltage between the bit line and a source line connected to a second terminal of the switch;
 wherein the memory cell comprises a conductive path between the second terminal of the resistive switching device and the first terminal of the switch.

17. The method of claim 16, wherein when writing to the memory cell, a current flows through the conductive path and not through the switch.

18. The method of claim 16, wherein when writing to the memory cell, a current flows through the conductive path and through the switch.

19. The method of claim 16, wherein the resistive switching device comprises a metal-insulator-metal switching device.

20. The method of claim 16, wherein the resistive switching device comprises a Magnetoresistive Tunnel Junction (MTJ) device.

* * * * *